(12) United States Patent
Kang et al.

(10) Patent No.: US 11,075,641 B1
(45) Date of Patent: Jul. 27, 2021

(54) ANALOG TO DIGITAL CONVERTER DEVICE AND METHOD FOR CALIBRATING CLOCK SKEW

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Ting-Hao Wang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/031,856

(22) Filed: Sep. 24, 2020

(30) Foreign Application Priority Data

Jan. 22, 2020 (TW) ................................ 109102627

(51) Int. Cl.
*H03M 1/10* (2006.01)
*H03M 1/08* (2006.01)
*H03M 1/12* (2006.01)

(52) U.S. Cl.
CPC ....... *H03M 1/1033* (2013.01); *H03M 1/0836* (2013.01); *H03M 1/121* (2013.01); *H03M 1/1023* (2013.01)

(58) Field of Classification Search
CPC ............. H03M 1/0836; H03M 1/1023; H03M 1/1033; H03M 1/121
USPC .......................................... 341/118, 120, 155
See application file for complete search history.

(56) References Cited

U.S. PATENT DOCUMENTS 8,159,377 B2 * 4/2012 Goldman ............ H03M 1/0624
341/118
10,177,778 B2 * 1/2019 Dyer ................... H03M 1/1028

\* cited by examiner

*Primary Examiner* — Khai M Nguyen
(74) *Attorney, Agent, or Firm* — CKC & Partners Co., LLC (57) ABSTRACT

An analog to digital converter (ADC) device includes ADC circuits, a calibration circuit, and a skew adjusting circuit. The ADC circuits convert an input signal according to interleaved clock signals, in order to generate first quantized outputs. The calibration circuit performs at least one calibration computation according to the first quantized outputs to generate second quantized outputs. The skew adjusting circuit determines calculating signals, to which the second quantized outputs correspond in a predetermined interval, and averages the calculating signals to generate a reference signal, and compares the reference signal with each of the calculating signals to generate detecting signals, and determines whether the detecting signals are adjusted or not according to a signal frequency to generate adjusting signals, in order to reduce a clock skew in the ADC circuits.

20 Claims, 8 Drawing Sheets

ANALOG TO DIGITAL CONVERTER DEVICE AND METHOD FOR CALIBRATING CLOCK SKEW

The present application claims the priority benefit of Taiwan Application Serial Number 109102627, filed Jan. 22 2020, which is incorporated herein by reference in its entirety.

BACKGROUND

Technical Field

The present disclosure relates to an analog to digital converter device. More particularly, the present disclosure relates to a time-interleaved analog to digital converter device and a clock skew calibration method thereof.

Description of Related Art

Analog-to-digital converter (ADC) has been often applied to a variety of electronic devices, to convert analog signals to digital signals to perform signal processing. In practical applications, the resolution or linearity of ADC will be affected by gain errors, voltage errors or timing errors. For timing errors, the existing technology has to set up complex circuits (such as additional reference ADC circuits, auxiliary ADC circuits) or use off-chip calibration to perform calibration, so that the power consumption or the calibration period of the ADC becomes higher and higher.

SUMMARY

In order to solve the problem mentioned above, one aspect of the present disclosure is to provide an analog to digital converter (ADC) device which includes a number of ADC circuits, a calibration circuit, and a skew adjusting circuit. The ADC circuits are configured to convert an input signal, according to a number of interleaved clock signals, to generate a number of first quantized outputs. The calibration circuit is configured to perform at least one calibration computation, according to the first quantized outputs, to generate a number of second quantized outputs. The skew adjusting circuit is configured to determine a number of calculating signals corresponding to the second quantized outputs respectively in a predetermined interval, and average the calculating signals to generate a reference signal, and compare the reference signal with each of the calculating signals to generate a number of detecting signals, and determine whether to adjust the detecting signals or not according to a signal frequency to generate a number of adjusting signals, in which the adjusting signals are configured to reduce a clock skew in the ADC circuits.

Some aspects of the present disclosure provide a method for calibrating clock skew. At least one calibrating operation is performed, according to a number of first quantized outputs generated by a number of analog to digital converter (ADC) circuits, to generate a number of second quantized outputs. A number of calculating signals are determined, corresponding to the second quantized outputs respectively in a predetermined interval, and the calculating signals are averaged to generate a reference signal, by a skew adjusting circuit. The reference signal is compared with the calculating signals respectively, to generate a number of detecting signals, by the skew adjusting circuit. Whether to adjust the detecting signals is determined according to a signal frequency, to generate a number of adjusting signals, by the skew adjusting circuit. The adjusting signals are configured to reduce a clock skew in the ADC circuits.

As described above, the ADC device and the method for calibrating clock skew are mainly aim to obtain the information of the clock skew by simple computation, and to calibrate the clock skew by selectively adjust the detecting signals according to the signal frequency, when the input signal frequency is higher than the Nyquist frequency. In this way, the power consumption and the calibration period can be reduced.

BRIEF DESCRIPTION OF THE DRAWINGS

The present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1A:
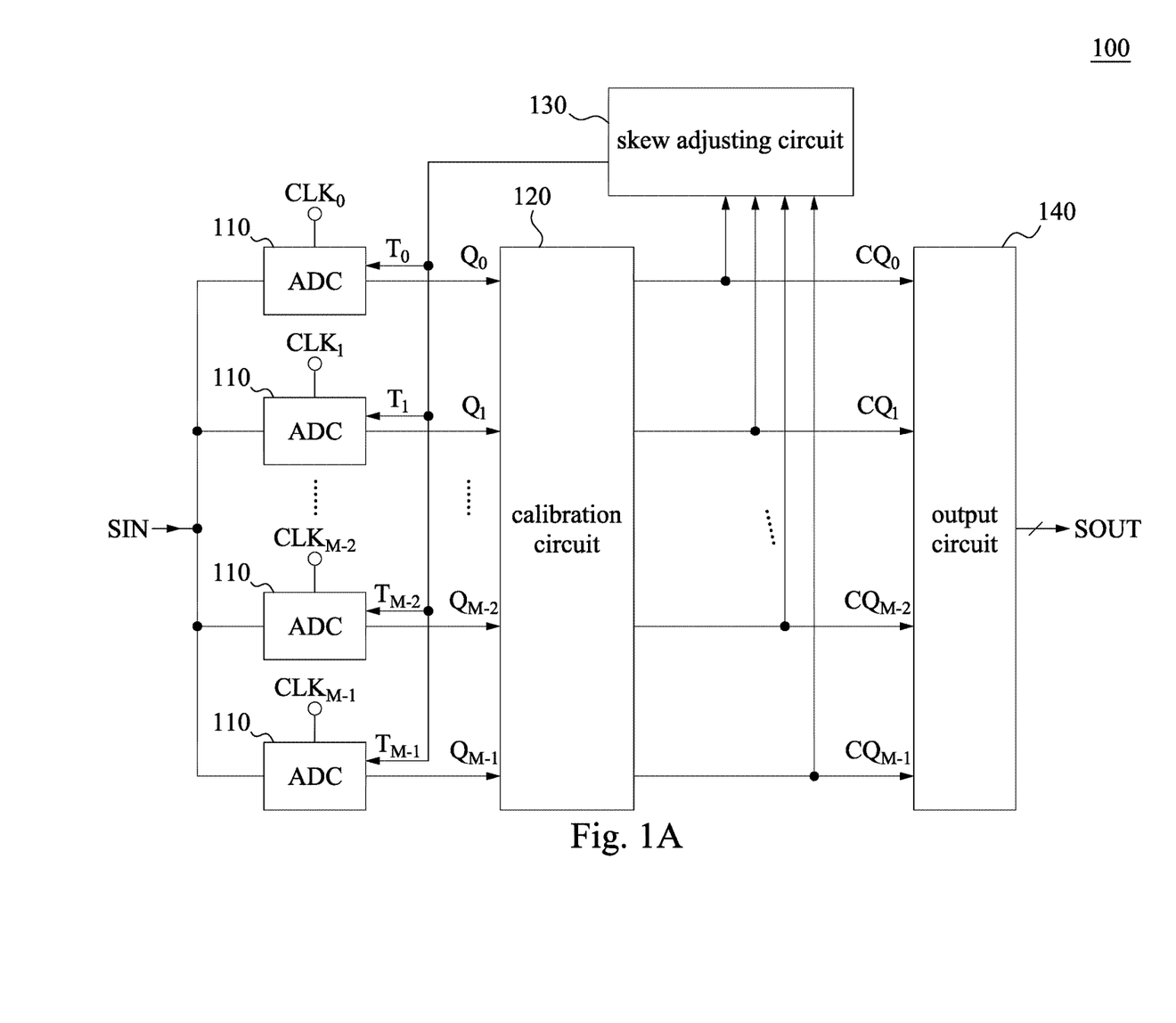
FIG. 1A is a schematic diagram illustrating an analog to digital converter (ADC) device, in accordance with some embodiments of the present disclosure.
Figure 1B:
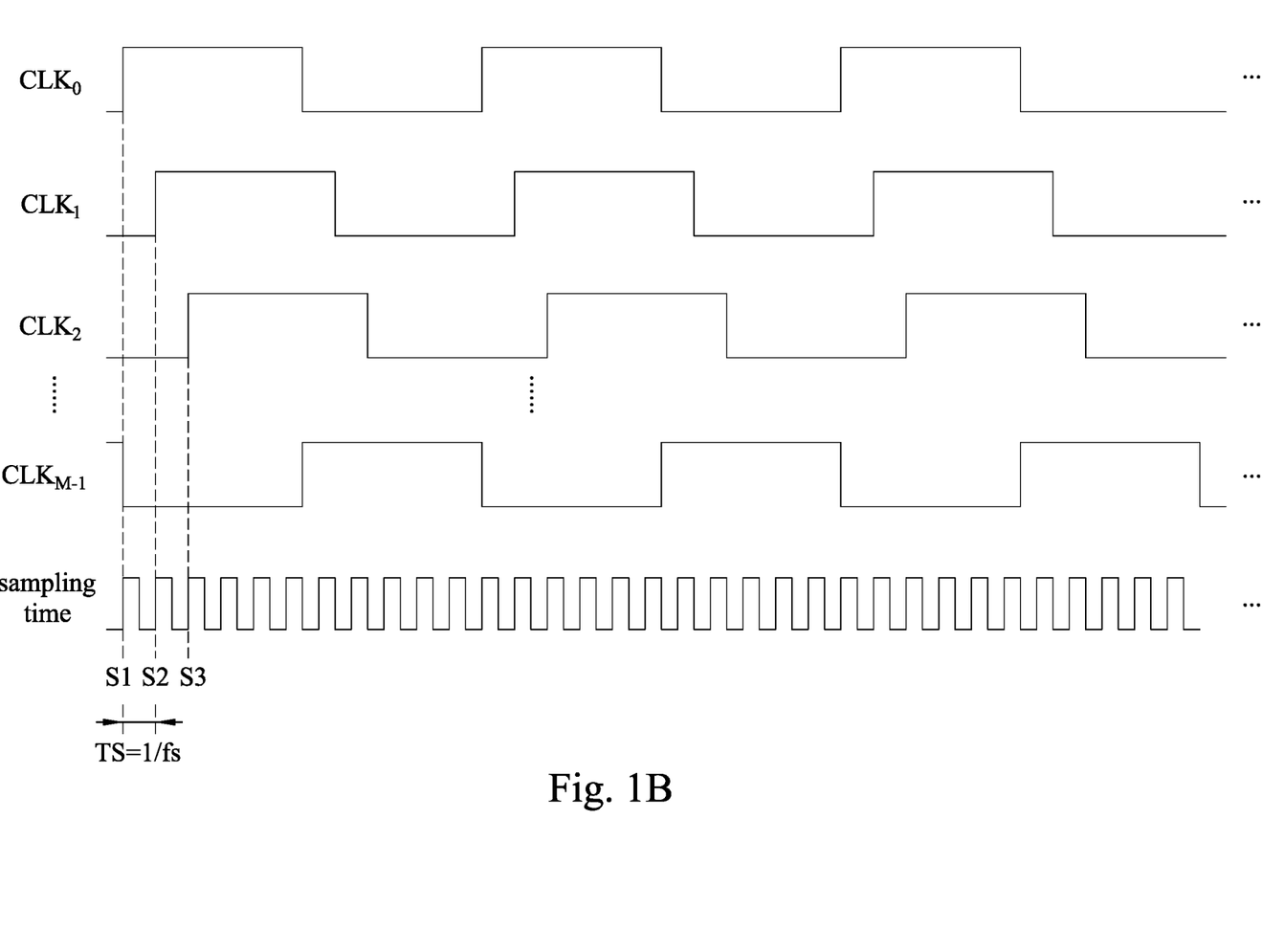
FIG. 1B is a waveform diagram illustrating a number of clock signals in FIG. 1A, in accordance with some embodiments of the present disclosure.

Reference is now made to FIG. 1A and FIG. 1B. FIG. 1A is a schematic diagram illustrating an analog to digital converter (ADC) device 100 in accordance with some embodiments of the present disclosure. FIG. 1B is a waveform diagram illustrating clock signals $CLK_0 \sim CLK_{M-1}$ in FIG. 1A in accordance with some embodiments of the present disclosure. In some embodiments, the ADC device 100 is operated as a multiple channel time-interleaved ADC.

In some embodiments, the ADC device 100 includes a number of ADC circuits 110, a calibration circuit 120, a skew adjusting circuit 130 and an output circuit 140. To be noticed, each of the ADC circuits 110 is operated as a single channel. In other words, in this embodiment, the ADC device 100 includes M channels. In some embodiments, M is an even number. As shown in FIG. 1A, the ADC circuits 110 are configured to perform analog to digital conversion on an input signal SIN according to one of the clock signals $CLK_0 \sim CLK_{M-1}$, to generate the corresponding one of the quantized outputs $Q_0 \sim Q_{M-1}$.

As shown in FIG. 1B, there is a time interval between two adjacent clock signals of the clock signals $CLK_0 \sim CLK_{M-1}$, and therefore, the first channel and the second channel perform sampling and analog to digital conversion at different times. For example, the first channel (i.e., the ADC circuits 110 operated according to the clock signal $CLK_0$) samples the input signal SIN at the first sampling time S1, and performs analog to digital conversion, and the second channel (i.e., the ADC circuits 110 operated according to the clock signal $CLK_1$) samples the input signal SIN at the second sampling time S2, and performs analog to digital conversion. The difference between the sampling time S1 and the sampling time S2 is sampling period TS (which corresponds to a sampling frequency fs, and TS=1/fs). Accordingly, reduced by analogy, the M channels can be operated according to a number of interleaving timing.

Following the previous description, the calibration circuit 120 is coupled to each of the ADC circuits 110, to receive a number of quantized outputs $Q_0 \sim Q_{M-1}$. The calibration circuit 120 can perform at least one calibration computation according to the quantized outputs $Q_0 \sim Q_{M-1}$, to calibrate offsets and gain errors in the ADC circuits 110, and generate calibrated quantized outputs $CQ_0 \sim CQ_{M-1}$.

In some embodiments, the calibration circuit 120 can be a foreground calibration circuit or a background calibration circuit. For example, the calibration circuit 120 can include a pseudo random value generator circuit (not shown in figure) and a digital processing circuit (not shown in figure), in which the pseudo random value generator circuit generates a calibration signal to the ADC circuits 110, and the digital processing circuit can perform an adaptation algorithm (i.e., the aforementioned at least one calibration computation) according to the quantized outputs $Q_0 \sim Q_{M-1}$ to reduce offsets or errors of quantized outputs $Q_0 \sim Q_{M-1}$. The aforementioned calibration circuit 120 is only an example, and the present disclosure is not limited thereto. Various types of calibration computations and the calibration circuit 120 are within the scope of the present disclosure.

Following the previous description, the skew adjusting circuit 130 is electrically coupled to the calibration circuit 120, to receive the calibrated quantized outputs $CQ_0 \sim CQ_{M-1}$. In some embodiments, the skew adjusting circuit 130 can analyze the clock skew (equivalent to phase error) between the ADC circuits 110 according to the quantized outputs $CQ_0 \sim CQ_{M-1}$, to generate the adjusting signals $T_0 \sim T_{M-1}$. In some embodiments, the skew adjusting circuit 130 outputs the adjusting signals $T_0 \sim T_{M-1}$ to the ADC circuits 110 respectively, and the adjusting signals $T_0 \sim T_{M-1}$ are configured to indicate the timing of the ADC circuits 110 which should be adjusted because of the clock skew.

In some embodiments, the ADC circuits 110 can adjust the execution timing of the sampling operation and/or the analog to digital conversion operation, according to the adjusting signals $T_0 \sim T_{M-1}$, to equivalently calibrate the clock skew. Or, in some embodiments, the timing of the clock signals $CLK_0 \sim CLK_{M-1}$ can be directly adjusted according to the adjusting signals $T_0 \sim T_{M-1}$, to equivalently reduce clock skew. For example, the adjusting signals $T_0 \sim T_{M-1}$ are inputted to the clock generator, phase interpolator, or a digital delay controller, which are configured to generate the clock signals $CLK_0 \sim CLK_{M-1}$, to adjust the phase of the clock signals $CLK_0 \sim CLK_{M-1}$. Aforementioned configurations of reducing the clock skew according to the adjusting signals $T_0 \sim T_{M-1}$ mentioned above are described for example, and the present disclosure is not limited thereto.

Following the previous description, the output circuit 140 is electrically coupled to the calibration circuit 120, to receive the calibrated quantized outputs $CQ_0 \sim CQ_{M-1}$. The output circuit 140 performs data combination operation according to the calibrated quantized outputs $CQ_0 \sim CQ_{M-1}$, to generate the digital signal SOUT. By operation of data combination, the quantized outputs $CQ_0 \sim CQ_{M-1}$ provided by the M channels can be combined as a single digital signal SOUT with a sampling frequency fs, in which the sampling frequency fs is M times of the clock signal frequency. In some embodiments, the output circuit 140 can be implemented by a multiplexer circuit, but the present disclosure is not limited thereto.

Figure 2:
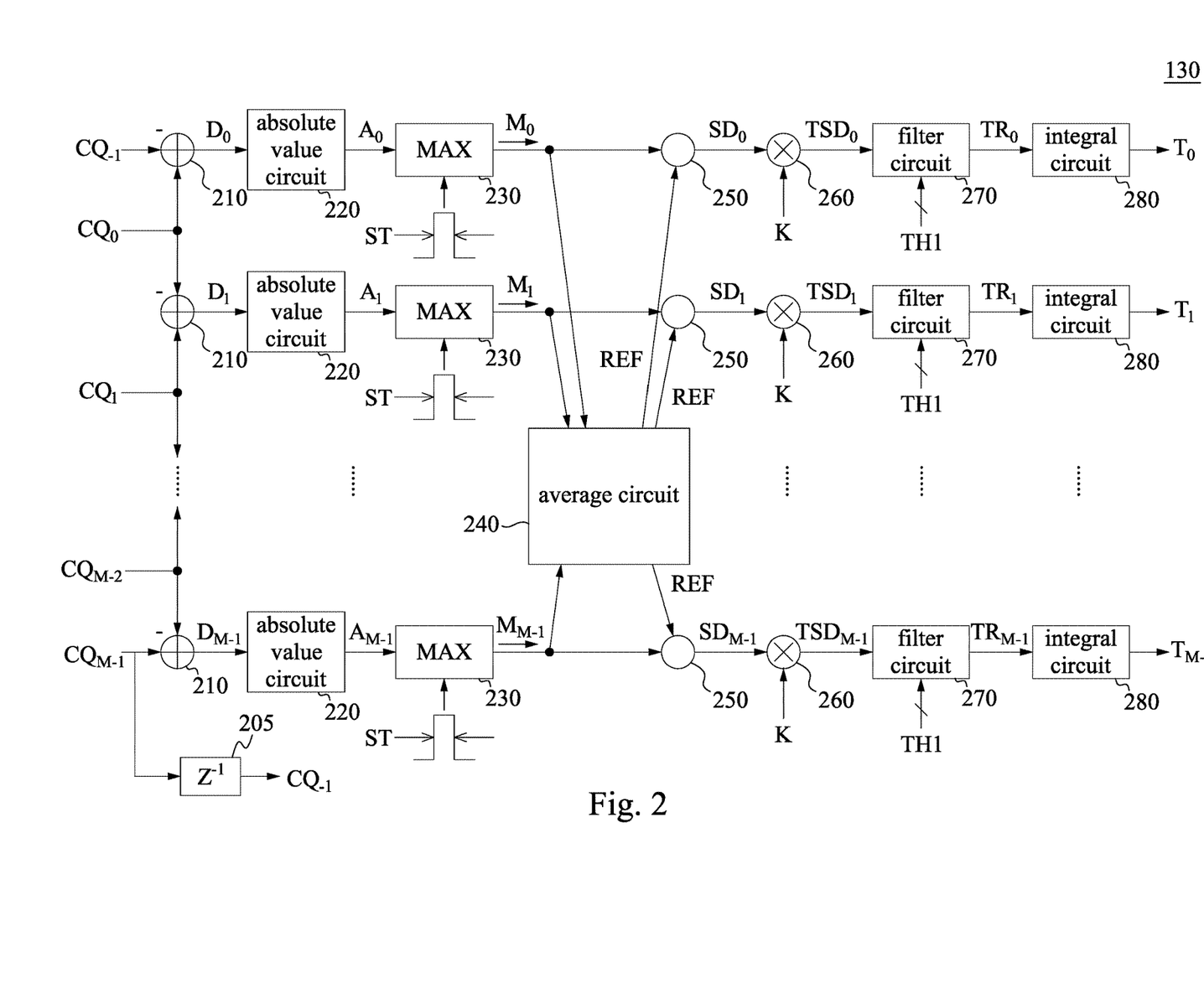
FIG. 2 is a schematic diagram illustrating a skew adjusting circuit, in accordance with some embodiments of the present disclosure.

Reference is now made to FIG. 2. FIG. 2 is a schematic diagram illustrating a skew adjusting circuit, in accordance with some embodiments of the present disclosure. For ease of understanding, similar components in FIG. 2 will be designated with the same label number referred to FIG. 1A. In some embodiments, the skew adjusting circuit 130 includes a delay circuit 205, a number of computation circuits 210, a number of absolute value circuits 220, a number of maximum value circuits 230, an average circuit 240, a number of comparison circuits 250, and a number of multiplication circuits 260.

The delay circuit 205 is configured to delay the quantized output $CQ_{M-1}$ in the FIG. 1A, to generate the delayed quantized outputs $CQ_{-1}$. In some embodiments, the delay time of the delay circuit 205 is equivalent to the period M×TS in FIG. 1B. The delay circuit 205 can be implemented by various digital circuits, such as a buffer, an inverter, a filter, etc. Embodiments of the delay circuit 205 mentioned above are only examples, and the present disclosure is not limited thereto.

The computation circuits 210 are electrically coupled to the calibration circuit 120 in FIG. 1A. The computation circuits 210 sequentially receive two of the quantized outputs $CQ_{-1} \sim CQ_{M-1}$, to generate a number of differential signals $D_0 \sim D_{M-1}$ respectively. For example, the first computation circuit 210 receives the quantized outputs $CQ_{-1}$ and $CQ_0$, and subtracts the quantized output $CQ_0$ by the quantized output $CQ_{-1}$ to generate a differential signal $D_0$. Configurations and operations of other computation circuits 210 are similar to the first computation circuit 210, which will not be described repeatedly herein. In some embodiments, the computation circuits 210 can be implemented by a subtractor or other processing circuits with the same function. Various circuits which can implement the computation circuits 210 are within the scope of the present disclosure.

The absolute value circuits 220 are electrically coupled to the computation circuits 210 respectively, to receive the differential signals $D_0 \sim D_{M-1}$ respectively. Each of the absolute value circuits 220 performs an absolute value computation according to the corresponding one of the differential signals $D_0 \sim D_{M-1}$, to generate a corresponding one of the absolute value signals $A_0 \sim A_{M-1}$. For example, the first absolute value circuit 220 receives the differential signal $D_0$, and performs an absolute value computation to receive the absolute value of the differential signal $D_0$, to generate the absolute value signals $A_0$. Configurations of other absolute value circuits 220 are similar to the first absolute value circuit 220, which will not be described repeatedly herein. In some embodiments, the absolute value circuits 220 can be implemented by a processing circuit or a rectifier circuit, and various circuits which can implement the absolute value circuits 220 are within the scope of the present disclosure.

The maximum value circuits 230 are electrically coupled to the absolute value circuits 220 respectively, to receive the absolute value signals $A_0 \sim A_{M-1}$ respectively. Each of the maximum value circuits 230 is configured to constantly receive one of the corresponding absolute value signal of the absolute value signals $A_0$~$A_{M-1}$ in a predetermined interval ST, and perform a maximum value computation to output a corresponding one of the calculating signals $M_0$~$M_{M-1}$. The corresponding one of the calculating signals $M_0$~$M_{M-1}$ is generated from a maximum value corresponding to the corresponding one of the absolute value signals in the predetermined interval ST. In some embodiments, the calculating signals $M_0$~$M_{M-1}$ generated from a maximum value computation can be also called as the maximum value signals. Configurations and operations of other maximum value circuits 230 are similar to the embodiments mentioned above, which will not be described repeatedly herein.

In some embodiments, the maximum value circuit 230 can be implemented by a digital processing circuit, a comparison circuit and/or a register circuit, but the present disclosure is not limited thereto. Various types of circuit for implementing the maximum value circuit 230 are within the scope of the present disclosure.

The average circuit 240 is electrically coupled to the maximum value circuits 230, to receive the calculating signals $M_0$~$M_{M-1}$. The average circuit 240 is configured to perform an average computation, according to the calculating signals $M_0$~$M_{M-1}$, to average the calculating signals $M_0$~$M_{M-1}$ to generate the reference signal REF. In some embodiments, the average circuit 240 can be implemented by the digital processing circuit, but the present disclosure is not limited thereto.

The comparison circuits 250 are coupled to the average circuit 240, to receive the reference signal REF. each of the comparison circuits 250 is configured to compare each of the calculating signals $M_0$~$M_{M-1}$ and the reference signal REF, to generate the corresponding one of detecting signals $SD_0$~$SD_{M-1}$. For example, the first comparison circuit 250 compares the calculating signal $M_0$ and the reference signal REF, to generate the detecting signal $SD_0$. Configurations and operations of other comparison circuits 250 are similar to the first comparison circuit 250, which will not be described repeatedly herein.

In some embodiments, the comparison circuits 250 can be implemented by a comparator. Or, in some embodiments, the comparison circuits 250 can be implemented by a subtractor circuit, and subtracts the reference signal REF by a corresponding one of the calculating signals $M_0$~$M_{M-1}$, to generate a corresponding one of the detecting signals $SD_0$~$SD_{M-1}$. The embodiments of the comparison circuits 250 mentioned above are only examples, and the present disclosure is no limited thereto.

The multiplication circuits 260 are electrically coupled to the comparison circuits 250, to receive the detecting signals $SD_0$~$SD_{M-1}$. Each of the multiplication circuits 260 is configured to multiply each of the detecting signals $SD_0$~$SD_{M-1}$ by a ratio value K according to the signal frequency, to generate a corresponding one of the adjusted detecting signals $TSD_0$~$TSD_{M-1}$. In some embodiments, the multiplication circuits 260 can be implemented by a multiplier circuit. In some other embodiments, the multiplication circuits 260 can be implemented by a multiplexer circuit, but the present disclosure is not limited thereto.

Following the previous description, when the signal frequency is higher than the threshold frequency, the multiplication circuits 260 are configured to multiply the detecting signals $SD_0$~$SD_{M-1}$ by the ratio value K, to generate the adjusted detecting signals $TSD_0$ $TSD_{M-1}$. In an embodiment, the frequency threshold voltage can be implemented as Nyquist frequency. For example, when the frequency of the input signal SIN is higher than Nyquist frequency, the ratio value K is set as −1, and the adjusted detecting signals $TSD_0$~$TSD_{M-1}$ are negative values of the detecting signals $SD_0$ $SD_{M-1}$.

Following the previous description, when the signal frequency is lower than the threshold frequency (i.e., the frequency of the input signal SIN is lower than the Nyquist frequency), the ratio value is set as 1, and accordingly the adjusted detecting signals $TSD_0$~$TSD_{M-1}$ and the detecting signals $SD_0$~$SD_{M-1}$ are the same.

Following the previous description, the operation of the first computation circuit 210 is taken for example, as shown in FIG. 2, because that the adjusting signals $T_0$ is generated based on the difference value between the quantized output $CQ_0$ and the quantized outputs $CQ_4$, the adjusting signals $T_0$ can indicate the time difference between time $T_0$ (i.e., the sampling time point corresponding to the quantized output $CQ_0$) and time $T_{-1}$ (i.e., the sampling time point corresponding to the quantized output $CQ_4$). The differential signal $D_0$ can be derived as the following equation (1) in time domain:

$$CQ_0 - CQ_{-1} = \sin(2\pi f(n+1)(T+\Delta t)) - \sin(2\pi f n T) \approx 2 \cos(2\pi f n T + \pi f(T+\Delta T)) \cdot \sin(\pi f T - \pi f n \Delta t) \quad (1)$$

$(n+1)(T+\Delta T)$ is equivalent to the sampling time point corresponding to the quantized output $CQ_0$, and k is referred to as the sampling time point corresponding to each of the quantized outputs $CQ_0$ or $CQ_{-1}$. In which, f is the frequency of the input signal SIN, $\Delta t$ is the time difference, and T is the aforementioned period TS.

When the frequency of the input signal SIN is far lower than Nyquist frequency (1/2T), the equation (1) can be further derived as the following equation (2):

$$\sin(2\pi f(n+1)(T+\Delta t)) - \sin(2\pi f n T) \approx 2 \cos(2\pi f n T + \pi f(T+\Delta t)) \cdot (\pi f T - \pi f n \Delta t) \quad (2)$$

As shown in equation (2), under the condition that the frequency f is far lower than 1/2T, the time difference $\Delta t$ is related to the amplitude of the differential signal $D_0$ (i.e., $\pi f T - \pi f n \Delta t$). Therefore, by operations of the absolute value circuits 220 and the maximum value circuit 230, information of the time difference $\Delta t$ can be reflected by the calculating signal $M_0$.

Accordingly, by comparing the calculating signal $M_0$ and the reference signal REF1, the influence of the time difference $\Delta t$ caused by the clock skew can be obtained. For example, if the calculating signal $M_0$ is higher than the reference signal REF, it means that the influence of the time difference $\Delta t$ is positive. Under this condition, the clock skew cause an incorrect leading phase of the clock signal $CLK_0$. Or, if the calculating signal $M_0$ is lower than the reference signal REF, it means that the influence of the time difference $\Delta t$ is negative. Under this condition, clock skew cause an incorrect lagging phase of the clock signal $CLK_0$. Therefore, according to different comparing results, the adjusted detecting signal $TSD_0$ has different logic values, to reflect the phase information of the first ADC circuit 110, which should be adjusted due to the clock skew. Similarly, the aforementioned operations can be adapted to each of the adjusting signals $T_0$~$T_{M-1}$ and the adjusted detecting signals $TSD_0$~$TSD_{M-1}$, which will not be described repeatedly herein.

when the frequency of the input signal SIN is higher than Nyquist frequency (1/2T), equation (1) can be further derived as the following equation (3):

$$\sin(2\pi f(n+1)(T+\Delta t)) - \sin(2\pi f n T) \approx 2 \cos(2\pi f n T + \pi f(T+\Delta t)) \cdot \sin(-\pi f T - \pi f n \Delta t) \quad (3)$$

As shown in equation (3), the amplitude of the time difference $\Delta t$ and the differential signal $D_0$ when the frequency f is higher than 1/2T, is the negative value of the amplitude of the time difference Δ t and the differential signal $D_0$ when the frequency f is lower than 1/2T. In other words, the following operations when the frequency f is higher than 1/2T, is the same as the frequency f is lower than 1/2T, after multiplying −1 on each value.

Following the previous description, in operations as follows, when the signal frequency is higher than the Nyquist frequency, the phase information of the ADC circuits 110 requires to be adjusted because of the clock skew can still be reflected by utilizing the adjusted detecting signals $TSD_0 \sim TSD_{M-1}$.

In some related technologies, they all aim to obtain information of clock skew when the signal frequency is lower than the Nyquist frequency. However, as the input frequency increases, information of the clock skew should be able to obtain when the signal frequency is higher than the Nyquist frequency, under the condition that the sampling frequency is hard to be increased. Accordingly, compared to the aforementioned technology, in the embodiments in the present disclosure, the ADC device can still be able to perform calibration, when the signal frequency inputted is higher than the Nyquist frequency, by receiving the clock skew information by simple computation, to achieve lower power consumption and less calibration period.

In some further embodiments, the skew adjusting circuit 130 can include a number of filter circuits 270 and a number of integral circuits 280. The filter circuits 270 are coupled to the multiplication circuits 260 respectively, to receive the adjusted detecting signals $TSD_0 \sim TSD_M$, respectively.

The filter circuits 270 generate a number of trigger signal $TR_0 \sim TR_{M-1}$ according to the adjusted detecting signals $TSD_0 \sim TSD_{M-1}$ and at least one threshold value TH1. The integral circuits 280 are coupled to the filter circuits 270 respectively, to receive the trigger signals $TR_0 \sim TR_{M-1}$ respectively. The integral circuits 280 generate the adjusting signals $T_0 \sim T_{M-1}$ according to the trigger signals $TR_0 \sim TR_{M-1}$.

Following the previous description, the first filter circuit 270 and the first integral circuit 280 are taken for example. The first filter circuit 270 is electrically coupled to the first multiplication circuit 260, to receive the adjusted detecting signal $TSD_0$. In some embodiments, the first filter circuit 270 can continuously accumulate the adjusted detecting signal $TSD_0$, and compare the accumulated adjusted detecting signal $TSD_0$ and the at least one threshold value TH1, to output one or more trigger signal $TR_0$. For example, when the accumulated adjusted detecting signal $TSD_0$ is higher than the at least one threshold value TH1, the first filter circuit 270 outputs the accumulated adjusted detecting signal $TSD_0$ as the trigger signal $TR_0$. The first integral circuit 280 is coupled to the first filter circuit 270, to receive the trigger signal $TR_0$. The integral circuits 280 are configured to accumulate the trigger signal $TR_0$, and output the accumulated trigger signal $TR_0$ as the adjusting signal $T_0$, to cooperate with different timing control methods. Configurations and operations of other filter circuits 270 and other integral circuits 280 are similar to the first filter circuit and the first integral circuit, which will not be described repeatedly herein.

By configuring the filter circuits 270, execution times of calibration can be reduced, to reduce dynamic power consumption of the ADC device 100. Meanwhile, jitter caused by the clock skew calibration can also be reduced by configuring the filter circuits 270. By configuring the integral circuits 280, the method can be adjusted by a corresponding value cooperated with the timing. In real applications, the filter circuits 270 and the integral circuits 280 can be selectively configured according to actual requirement. In addition, the aforementioned threshold value TH1 can also be adjusted according to actual requirement.

In different embodiments, the aforementioned filter circuits 270 and the integral circuits 280 can be implemented by at least one comparator (e.g., the one configured to compare the trigger signal and the threshold value TH1 or compare the accumulated trigger signal), at least one register (e.g., the one configured to store the aforementioned accumulated signals or the accumulated trigger signals, etc.), at least one removing circuit (e.g., the one configured to remove data in the register mentioned above) and/or at least one computation circuit (e.g., the one configured to generate accumulated signals or configured to accumulate the trigger signals). Configurations of the filter circuits 270 and the integral circuits 280 mentioned above are only examples, and the present disclosure is not limited thereto.

Figure 3:
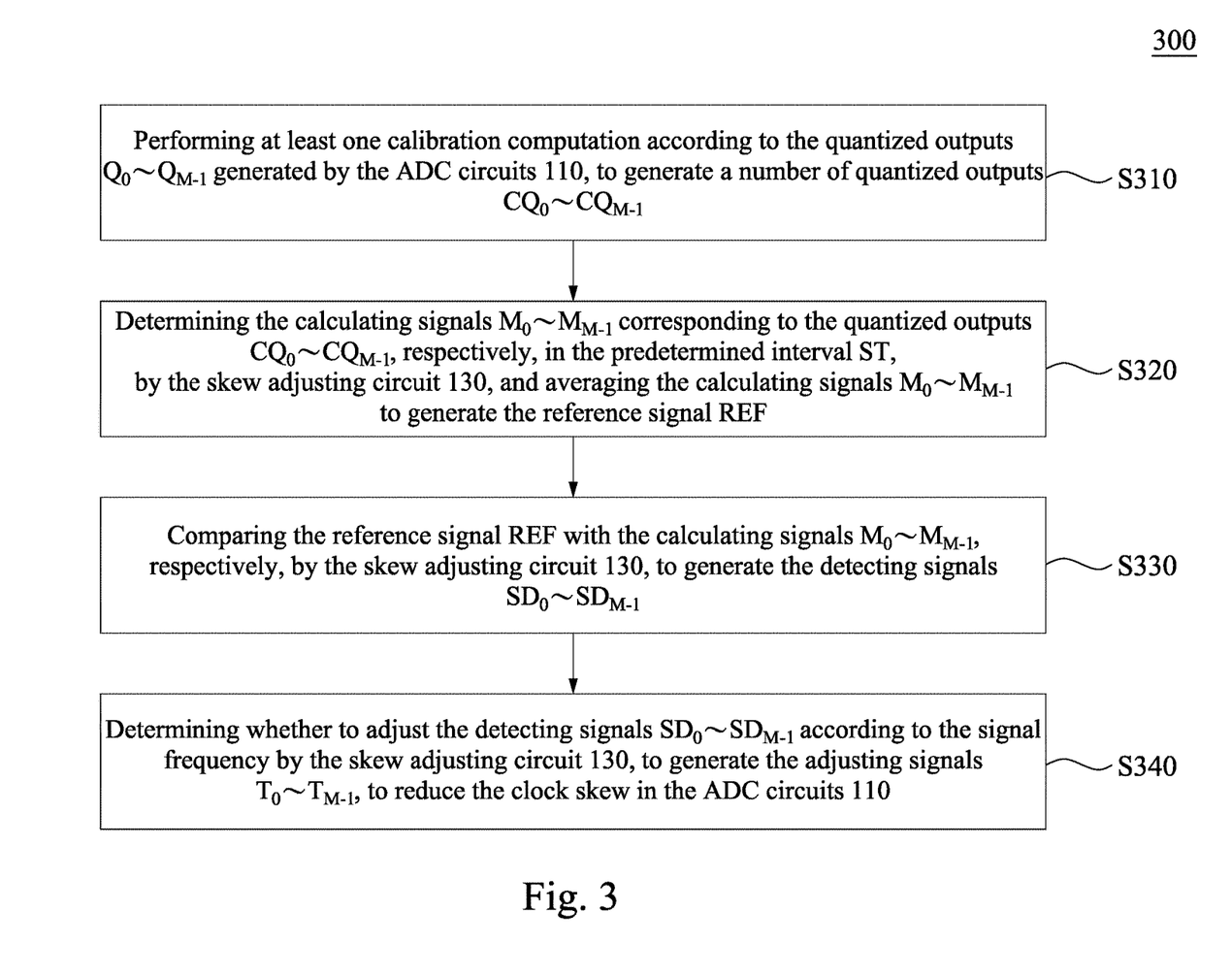
FIG. 3 is a flowchart illustrating a clock skew calibration method, in accordance with some embodiments of the present disclosure.

Reference is now made to FIG. 3, FIG. 3 is a flowchart illustrating a clock skew calibration method 300, in accordance with some embodiments of the present disclosure. For ease of understanding, the clock skew calibration method 300 will be described with the references of aforementioned figures. In an embodiments, the clock skew calibration method 300 firstly operates a step S310, performing at least one calibration computation according to the quantized outputs $Q_0 \sim Q_{M-1}$ generated by the ADC circuits 110, to generate a number of quantized outputs $CQ_0 \sim CQ_{M-1}$.

Then, the clock skew calibration method 300 operates step S320, determining the calculating signals $M_0 \sim M_{M-1}$ corresponding to the quantized outputs $CQ_0 \sim CQ_{M-1}$, respectively, in the predetermined interval ST, by the skew adjusting circuit 130, and averaging the calculating signals $M_0 \sim M_{M-1}$ to generate the reference signal REF.

Following the previous description, in step S330, comparing the reference signal REF with the calculating signals $M_0 \sim M_{M-1}$, respectively, by the skew adjusting circuit 130, to generate the detecting signals $SD_0 \sim SD_{M-1}$.

Following the previous description, in step S340, determining whether to adjust the detecting signals $SD_0 \sim SD_{M-1}$ according to the signal frequency by the skew adjusting circuit 130, to generate the adjusting signals $T_0 \sim T_{M-1}$, to reduce the clock skew in the ADC circuits 110. The description and embodiments of each of the operations mentioned above can be referred to the embodiments described above, which will not be described repeatedly herein.

Figure 4:
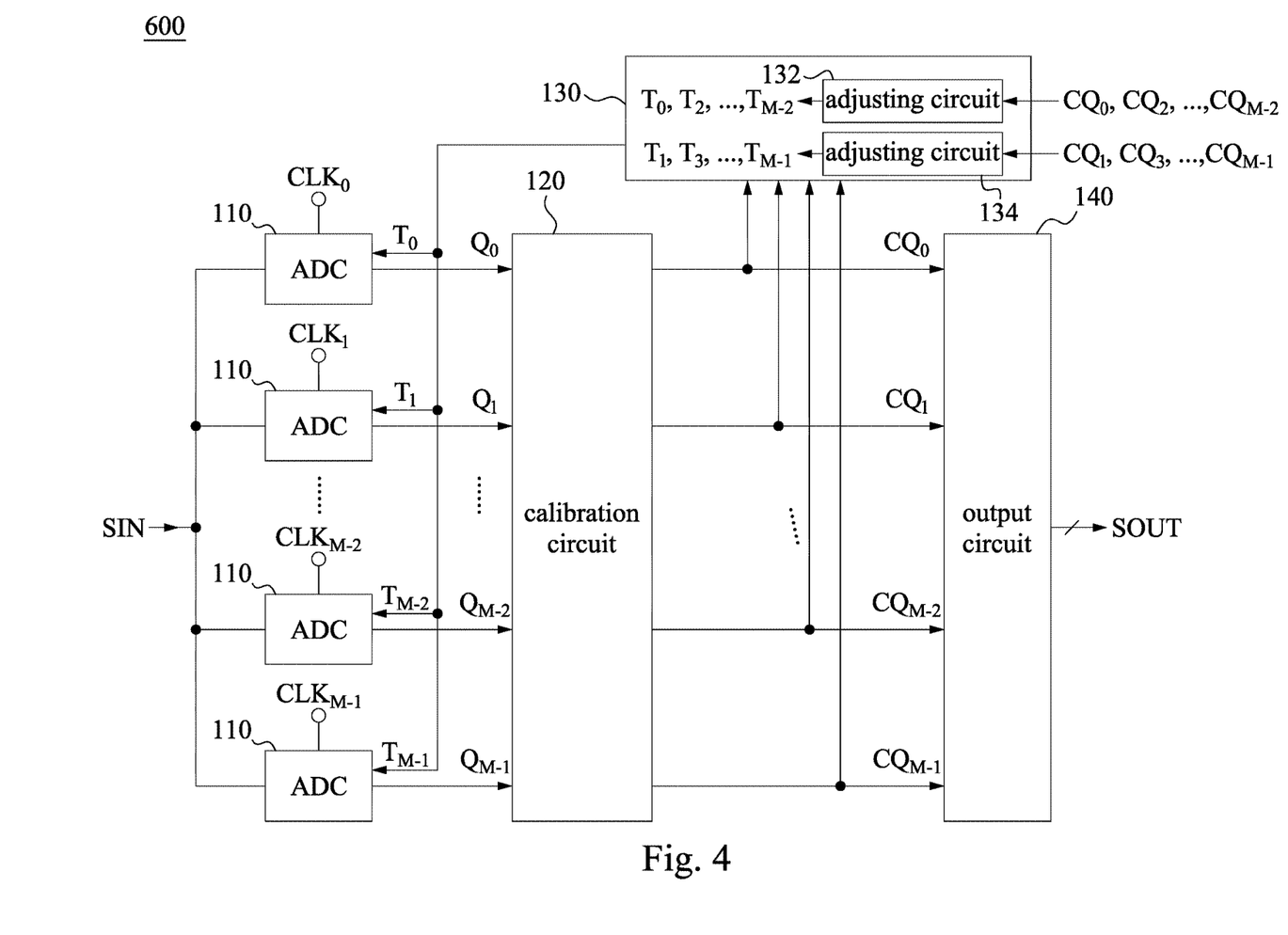
FIG. 4 is a schematic diagram illustrating an analog to digital converter (ADC) device, in accordance with some embodiments of the present disclosure.

In another embodiment, FIG. 4 is a schematic diagram illustrating an analog to digital converter (ADC) device 400, in accordance with some embodiments of the present disclosure. In some embodiments, the ADC device 400 is operated as a multi-channeled time-interleaved ADC. In this embodiment, the ADC device 400 is similar to the ADC device 100, in which the difference between the ADC device 100 and the ADC device 400 is the embodiments of the skew adjusting circuit 130.

Following the previous description, in this embodiment, the skew adjusting circuit 130 includes the adjusting circuit 132 and the adjusting circuit 134. The adjusting circuit 132 is configured to analyze the even quantized outputs $CQ_0$, $CQ_2, \ldots, CQ_{M-2}$ of the quantized outputs $CQ_0 \sim CQ_{M-1}$, to generate a first portion (i.e., $T_0, T_2, \ldots, T_{M-2}$) of the adjusting signals $T_0 \sim T_{M-1}$, and the adjusting circuit 134 is configured to analyze the odd quantized outputs $CQ_1$, $CQ_3, \ldots, CQ_{M-1}$ of the quantized outputs $CQ_0 \sim CQ_{M-1}$, to generate a second portion of the adjusting signals $T_0 \sim T_{M-1}$ (i.e., $T_1, T_3, \ldots, T_{M-1}$).

The adjusting circuit 132 analyzes the clock skew (equivalent to time difference information) between the even ADC circuits 110 according to the even quantized outputs $CQ_0, CQ_2, \ldots, CQ_{M-2}$, to generate the adjusting signals $T_0, T_2, \ldots, T_{M-2}$. Since the quantized output $CQ_0$ corresponds to the first sampling time S1 and the quantized output $CQ_2$ corresponds to the third sampling time S3, the period difference between these two sampling times is two sampling period TS, and accordingly the time difference information of the clock signal $CLK_0$ and the clock signal $CLK_2$ in two sampling periods TS can be available by analyzing the quantized output $CQ_0$ and the quantized output $CQ_2$. Similarly, in this way, the time difference information of the clock signals $CLK_0, CLK_2, \ldots, CLK_{M-2}$ in two sampling periods TS can be analyzed by the adjusting circuit 132.

Similarly, the adjusting circuit 134 analyzes the clock skews existed between the odd ADC circuits 110 according to the odd quantized outputs $CQ_1, CQ_3, \ldots, CQ_{M-1}$, to generate the adjusting signals $T_1, T_3, \ldots, T_{M-1}$. In this way, the adjusting circuit 134 can analyze a time difference information of the clock signals $CLK_1, CLK_3, \ldots, CLK_{M-1}$ in two sampling periods TS.

Figure 5A:
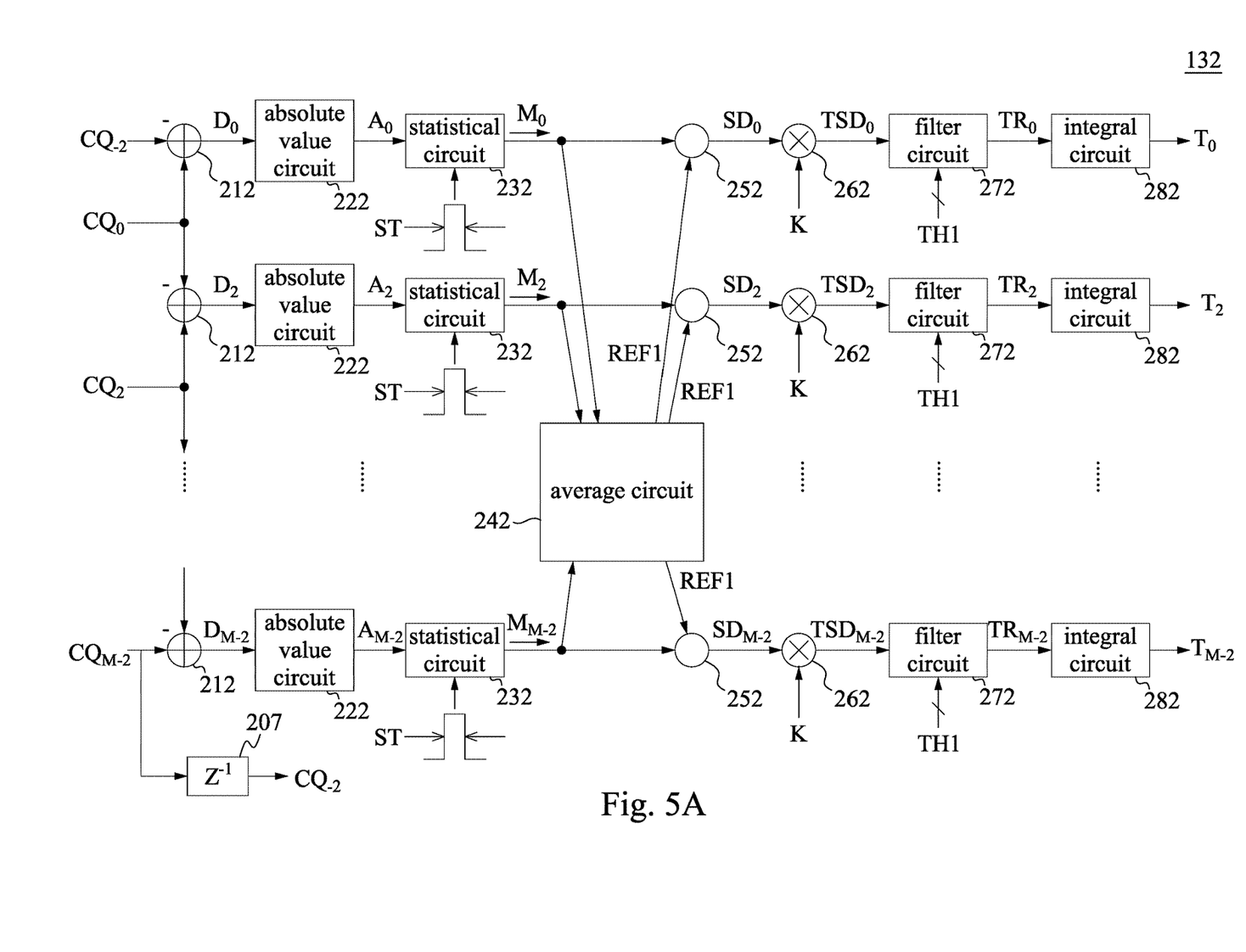
FIG. 5A and FIG. 5B are schematic diagrams illustrating the adjusting circuit in FIG. 4, in accordance with some embodiments of the present disclosure.
Figure 5B:
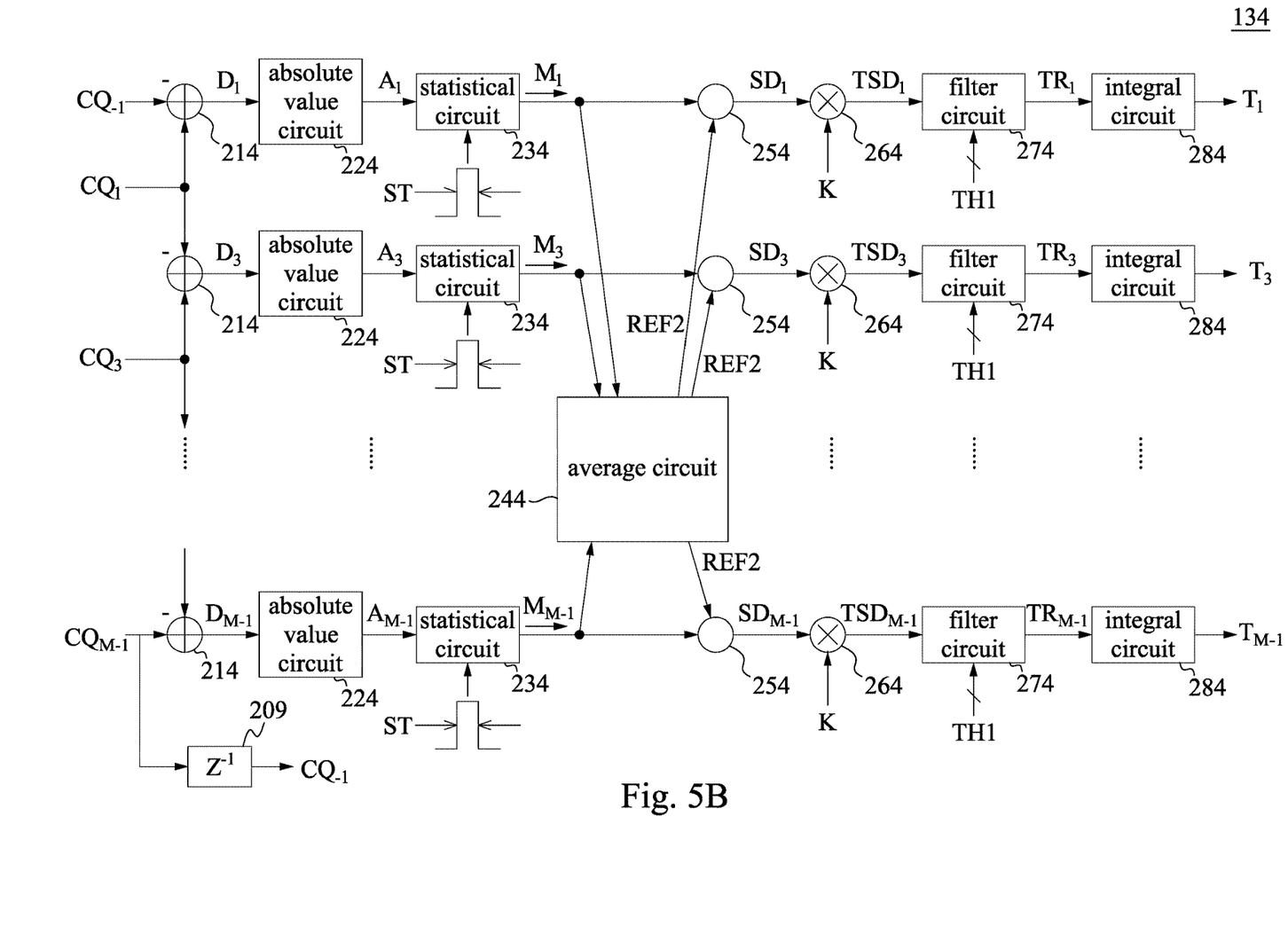

Reference is now made to FIG. 5A and FIG. 5B, FIG. 5A and FIG. 5B are schematic diagrams illustrating the adjusting circuit in FIG. 4, in accordance with some embodiments of the present disclosure. The adjusting circuit 132 is configured to perform statistical computation, to determine the calculating signals (e.g., the calculating signals $M_0, M_2, \ldots, M_{M-2}$ in FIG. 5A) corresponding to the even quantized outputs $CQ_0, CQ_2, CQ_{M-2}$, respectively, and average these calculating signals to generate the reference signals (e.g., the reference signal REF1 in FIG. 5A). The adjusting circuit 132 further compares the reference signals and the calculating signals, to generate the aforementioned adjusting signals $T_0, T_2, \ldots, T_{M-2}$. Related operations in detail will be described in the following paragraphs with reference to FIG. 5A.

Correspondingly, in some embodiments, the adjusting circuit 134 is configured to perform the statistic computation, to determine the calculating signals (e.g., the calculating signals $M_1, M_3, \ldots, M_{M-1}$ in FIG. 5B) corresponding to the odd quantized outputs $CQ_1, CQ_3, \ldots, CQ_{M-1}$, respectively, and average these calculating signals to generate the reference signals (e.g., the reference signal REF2 in FIG. 5B). The adjusting circuit 134 further compares the reference signals and the calculating signals, to generate the aforementioned adjusting signals $T_1, T_3, \ldots, T_{M-1}$.

In some embodiments, the ADC circuits 110 can adjust the execution timing of the sampling operation and/or the ADC operation, according to the adjusting signals $T_0 \sim T_{M-1}$, to equivalently calibrate the clock skew. Operations of the ADC circuits 110 are similar to the aforementioned embodiments, which will not be described repeatedly herein.

As shown in FIG. 5A, an adjusting circuit 132 includes a delay circuit 207, a number of computation circuits 212, a number of absolute value circuits 222, a number of statistical circuits 232, an average circuit 242, a number of comparison circuits 252, and a number of multiplication circuits 262. Operations of the delay circuit 207, the computation circuits 212, the absolute value circuits 222, the average circuit 242, and the comparison circuits 252 are similar to the embodiments of the delay circuit 205, the computation circuits 210, the absolute value circuits 220, the average circuit 240 and the comparison circuits 250, which will not be described repeatedly herein.

Following the previous description, the statistical circuits 232 are coupled to the absolute value circuits 222 respectively, to receive the absolute value signals $A_0, A_2, \ldots, A_{M-2}$ respectively. Each of the statistical circuits 232 is configured to constantly receive a corresponding one of the absolute value signals $A_0, A_2, \ldots, A_{M-2}$ in the predetermined interval ST, and perform statistical computation to output a corresponding one of the calculating signals $M_0, M_2, M_{M-2}$.

In some embodiments, the aforementioned statistical computation can be a maximum value computation or an average computation. For example, the first statistical circuit 232 keep receives the absolute value signals $A_0$ in the predetermined interval ST, and perform maximum value computation to output the highest absolute value signals $A_0$ received in the predetermined interval ST as the calculating signal $M_0$. Or, the first statistical circuit 232 keep receives the absolute value signals $A_0$ in the predetermined interval ST, and perform the average computation to average all of the absolute value signals $A_0$ received in the predetermined interval as the calculating signal $M_0$. Configurations and operations of other statistical circuits 232 are similar to the first statistical circuit 232, which will not be described repeatedly herein.

In some embodiments, each of the statistical circuits 232 can be implemented by a digital processing circuit, a comparison circuit and/or a register circuit, but the present disclosure is not limited thereto. Various circuits which can implement the statistical circuits 232 are within the scope of the present disclosure.

Following the previous description, operations of the multiplication circuits 262 are similar to those of the multiplication circuits 260. The multiplication circuits 262 are electrically coupled to the comparison circuits 252, to receive the detecting signals $SD_0, \ldots, SD_{M-2}$. Each of the multiplication circuits 262 is configured to multiply each of the detecting signals $SD_0, \ldots, SD_{M-2}$ by a ratio value K to generate the adjusted detecting signals $TSD_0, TSD_{M-2}$ correspondingly.

Following the previous description, when the signal frequency is higher than the threshold frequency, the multiplication circuits 262 are configured to multiply each of the detecting signals $SD_0, \ldots, SD_{M-2}$ by a ratio value K to generate the adjusted detecting signals $TSD_0, TSD_{M-2}$. In an embodiment, the threshold frequency can be implemented as the Nyquist frequency. For example, when the frequency of the input signal SIN is higher than the Nyquist frequency, the ratio value K is set as −1, and the adjusted detecting signals $TSD_0, TSD_{M-2}$ are negative values of the detecting signals $SD_0, SD_{M-2}$.

Following the previous description, when the signal frequency is lower than the threshold frequency (i.e., the input signal SIN is lower than the Nyquist frequency), the ratio value K is set as 1, and the adjusted detecting signals $TSD_0, TSD_{M-2}$ are the same as the detecting signals $SD_0, \ldots, SD_{M-2}$.

Following the previous description, the operation of the second computation circuit 212 is taken for example, as shown in FIG. 5A, because that the adjusting signals $T_2$ is generated based on a difference between the quantized output $CQ_0$ and the quantized output $CQ_2$, the adjusting signals $T_2$ can be indicated to a time difference between a sampling time S1 corresponding to the quantized output $CQ_0$ and a sampling time S3 corresponding to the quantized output $CQ_2$. Derivation of a differential signal $D_2$ in time domain is the same as the equation (1), which will not be described repeatedly herein.

In some embodiments, the adjusting circuit 132 can further includes a number of filter circuits 272 an a number of integral circuits 282. The filter circuits 272 are coupled to the multiplication circuits 262, respectively, to receive the adjusted the detecting signals $TSD_0$, $TSD_2$, $TSD_{M-2}$ respectively. Embodiments of the filter circuits 272 and the integral circuits 282 are similar to the filter circuits 270 and the integral circuits 280 mentioned above, which will not be described repeatedly herein.

Reference is now made to FIG. 5B, as shown in FIG. 5B, the adjusting circuit 134 includes a delay circuit 209, a number of computation circuits 214, a number of absolute value circuits 224, a number of statistical circuits 234, an average circuit 244, a number of comparison circuits 254, a number of multiplication circuits 264, a number of filter circuits 274, and a number of integral circuits 284. The circuit construction of the adjusting circuit 134 is the same as the circuit construction of the adjusting circuit 132, and the operation of the adjusting circuit 134 is also similar to that of the adjusting circuit 132, which will not be described repeatedly herein.

Figure 6:
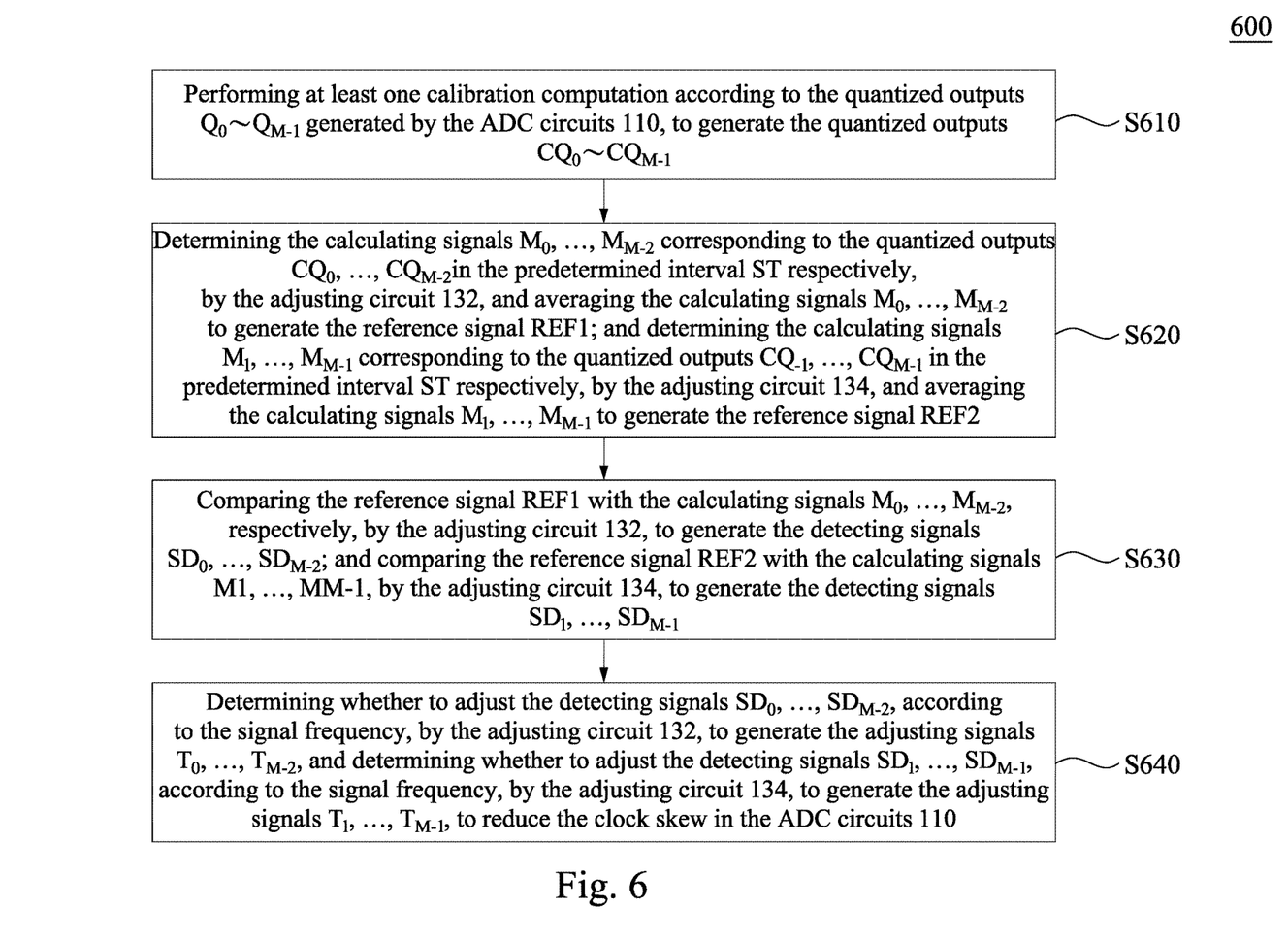
FIG. 6 is a flowchart illustrating a clock skew calibration method, in accordance with some embodiments of the present disclosure.

Reference is now made to FIG. 6. FIG. 6 is a flowchart illustrating a clock skew calibration method 600, in accordance with some embodiments of the present disclosure. For ease of understanding, the clock skew calibration method 600 will be described with references of the figures mentioned above. In an embodiment, the clock skew calibration method 600 firstly perform step S610, performing at least one calibration computation according to the quantized outputs $Q_0 \sim Q_{M-1}$ generated by the ADC circuits 110, to generate the quantized outputs $CQ_0 \sim CQ_{M-1}$.

Then, the clock skew calibration method 600 performs step S620, determining the calculating signals $M_0, \ldots, M_{M-2}$ corresponding to the quantized outputs $CQ_0, \ldots, CQ_{M-2}$ in the predetermined interval ST respectively, by the adjusting circuit 132, and averaging the calculating signals $M_0, \ldots, M_{M-2}$ to generate the reference signal REF1; and determining the calculating signals $M_1, \ldots, M_{M-1}$ corresponding to the quantized outputs $CQ_{-1}, \ldots, CQ_{M-1}$ in the predetermined interval ST respectively, by the adjusting circuit 134, and averaging the calculating signals $M_1, \ldots, M_{M-1}$ to generate the reference signal REF2.

Following the previous description, in step S630, comparing the reference signal REF1 with the calculating signals $M_0, \ldots, M_{M-2}$, respectively, by the adjusting circuit 132, to generate the detecting signals $SD_0, \ldots, SD_{M-2}$; and comparing the reference signal REF2 with the calculating signals $M_1, \ldots, M_{M-1}$, by the adjusting circuit 134, to generate the detecting signals $SD_1, \ldots, SD_{M-1}$.

Following the previous description, in step S640, determining whether to adjust the detecting signals $SD_0, \ldots, SD_{M-2}$, according to the signal frequency, by the adjusting circuit 132, to generate the adjusting signals $T_0, \ldots, T_{M-2}$, and determining whether to adjust the detecting signals $SD_1, \ldots, SD_{M-1}$, according to the signal frequency, by the adjusting circuit 134, to generate the adjusting signals $T_1, \ldots T_{M-1}$, to reduce the clock skew in the ADC circuits 110. The description and embodiments of each of the operations mentioned above can be referred to the embodiments described above, which will not be described repeatedly herein.

In sum, the ADC device and the clock skew calibration method in the present disclosure are mainly aim to obtain the information of the clock skew by simple computation, and to calibrate the clock skew by selectively adjust the detecting signals according to the signal frequency, when the input signal frequency is higher than the Nyquist frequency. In this way, the power consumption and the calibration period can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog to digital converter (ADC) device comprising:
   a plurality of ADC circuits configured to convert an input signal, according to a plurality of interleaved clock signals, to generate a plurality of first quantized outputs;
   a calibration circuit configured to perform at least one calibration computation, according to the plurality of first quantized outputs, to generate a plurality of second quantized outputs; and
   a skew adjusting circuit configured to determine a plurality of calculating signals corresponding to the plurality of second quantized outputs respectively in a predetermined interval, and average the plurality of calculating signals to generate a reference signal, and compare the reference signal with each of the plurality of calculating signals to generate a plurality of detecting signals, and determine whether to adjust the plurality of detecting signals or not according to a signal frequency to generate a plurality of adjusting signals, wherein the plurality of adjusting signals are configured to reduce a clock skew in the plurality of ADC circuits.

2. The analog to digital converter device of claim 1, wherein the skew adjusting circuit is further configured to perform a plurality of absolute value computations on a plurality of differential signals respectively to generate a plurality of absolute value signals, and perform a plurality of maximum value computations on the plurality of absolute value signals to generate the plurality of calculating signals, wherein the plurality of differential signals is generated according to the plurality of second quantized outputs.

3. The analog to digital converter device of claim 1, wherein when the signal frequency is higher than a threshold frequency, the skew adjusting circuit is configured to multiply the plurality of detecting signals by a first ratio value to generate the plurality of adjusting signals.

4. The analog to digital converter device of claim 1, wherein when the signal frequency is lower than a threshold frequency, the skew adjusting circuit is configure to multiply the plurality of detecting signals by a second ratio value to generate the plurality of adjusting signals.

5. The analog to digital converter device of claim 2, wherein the skew adjusting circuit comprising:
   a delay circuit configured to delay a last one of the plurality of second quantized outputs, to generate a delay quantized output;
   a plurality of computation circuits configured to receive the delay quantized output and the plurality of second quantized outputs sequentially, and generate a plurality of differential signals according to the delay quantized output and two of the plurality of second quantized outputs respectively;
   a plurality of absolute value circuits, wherein each of the plurality of absolute value circuits is configured to perform an absolute value computation according to a corresponding differential signal of the plurality of differential signals and generate a corresponding absolute value signal of the plurality of absolute value signals;
a plurality of maximum value circuits, wherein each of the plurality of maximum value circuits is configured to receive the corresponding absolute value signal and perform a maximum value computation to output a corresponding calculating signal of the plurality of calculating signals, wherein the corresponding calculating signal is generated from a maximum value of the corresponding absolute value signal in the predetermined interval;
an average circuit configured to perform an average computation, to average the plurality of calculating signals to generate the reference signal;
a plurality of comparison circuit configured to compare the reference signal with each of the plurality of calculating signals to generate the plurality of detecting signals; and
a plurality of multiplication circuit configured to multiply the plurality of detecting signals by a first ratio value or a second ratio value to generate the plurality of adjusting signals.

6. The analog to digital converter device of claim 1, wherein the skew adjusting circuit comprising:
a first adjusting circuit configured to analyze a plurality of even quantized outputs of the plurality of second quantized outputs, to generate a first portion of the plurality of adjusting signals; and
a second adjusting circuit configured to analyze a plurality of odd quantized outputs of the plurality of second quantized outputs, to generate a second portion of the plurality of adjusting signals.

7. The analog to digital converter device of claim 6, wherein when the signal frequency is higher than a threshold frequency, the first adjusting circuit is configured to multiply a plurality of even detecting signals of the plurality of detecting signals by a first ratio value to generate the first portion of the plurality of adjusting signals, and the second adjusting circuit is configured to multiply a plurality of odd detecting signals of the plurality of detecting signals by the first ratio value to generate the second portion of the plurality of adjusting signals.

8. The analog to digital converter device of claim 6, wherein when the signal frequency is lower than a threshold frequency, the first adjusting circuit is configured to multiply a plurality of even detecting signals of the plurality of detecting signals by a second ratio value to generate the first portion of the plurality of adjusting signals, and the second adjusting circuit is configured to multiply a plurality of odd detecting signals of the plurality of detecting signals by the second ratio value to generate the second portion of the plurality of adjusting signals.

9. The analog to digital converter device of claim 6, wherein the first adjusting circuit further comprising:
a delay circuit configured to delay a last one of the plurality of even quantized outputs, to generate a delay quantized output;
a plurality of computing circuits configured to sequentially receive the delay quantized output and the plurality of even quantized outputs, and configured to generate a plurality of differential signals, respectively, according to the delay quantized output and two of the plurality of second quantized outputs;
a plurality of absolute value circuits, wherein each of the plurality of absolute value circuits is configured to perform an absolute value computation according to a corresponding differential signal of the plurality of differential signals and generate a corresponding absolute value signal;
a plurality of statistical circuits, wherein each of the plurality of statistical circuits is configured to receive the corresponding absolute value signal in the predetermined interval, and perform a statistical computation, to generate a corresponding calculating signal of the plurality of calculating signals;
an average circuit configured to perform an average computation, to average the plurality of calculating signals to generate the reference signal;
a plurality of comparison circuit configured to compare the reference signal with each of the plurality of calculating signals to generate the plurality of detecting signals; and
a plurality of multiplication circuit configured to multiply a plurality of even detecting signals of the plurality of detecting signals by a first ratio value or a second ratio value to generate the first portion of the plurality of adjusting signals.

10. The analog to digital converter device of claim 6, wherein the second adjusting circuit further comprising:
a delay circuit configured to delay a last one of the plurality of odd quantized outputs, to generate a delay quantized output;
a plurality of computing circuits configured to sequentially receive the delay quantized output and the plurality of odd quantized outputs, and configured to generate a plurality of differential signals, respectively, according to the delay quantized output and two of the plurality of second quantized outputs;
a plurality of absolute value circuits, wherein each of the plurality of absolute value circuits is configured to perform an absolute value computation according to a corresponding differential signal of the plurality of differential signals and generate a corresponding absolute value signal;
a plurality of statistical circuits, wherein each of the plurality of statistical circuits is configured to receive the corresponding absolute value signal in the predetermined interval, and perform a statistical computation, to generate a corresponding calculating signal of the plurality of calculating signals;
an average circuit configured to perform an average computation, to average the plurality of calculating signals to generate the reference signal;
a plurality of comparison circuit configured to compare the reference signal with each of the plurality of calculating signals to generate the plurality of detecting signals; and
a plurality of multiplication circuit configured to multiply a plurality of odd detecting signals of the plurality of detecting signals by a first ratio value or a second ratio value to generate the second portion of the plurality of adjusting signals.

11. A method for calibrating clock skew, comprising:
performing at least one calibrating operation, according to a plurality of first quantized outputs generated by a plurality of analog to digital converter (ADC) circuits, to generate a plurality of second quantized outputs;
determining a plurality of calculating signals, corresponding to the plurality of second quantized outputs respectively in a predetermined interval, and average the plurality of calculating signals to generate a reference signal, by a skew adjusting circuit;

comparing the reference signal with the plurality of calculating signals respectively, to generate a plurality of detecting signals, by the skew adjusting circuit; and determining whether to adjust the plurality of detecting signals or not according to a signal frequency, to generate a plurality of adjusting signals, by the skew adjusting circuit;

wherein the plurality of adjusting signals are configured to reduce a clock skew in the plurality of ADC circuits.

12. The method for calibrating clock skew of claim 11, wherein the operation of determining the plurality of calculating signals further comprising:

performing a plurality of absolute value computations on a plurality of differential signals respectively to generate a plurality of absolute value signals, wherein the plurality of differential signals is generated according to the plurality of second quantized outputs; and performing a plurality of maximum value computations on the plurality of absolute value signals to generate the plurality of calculating signals.

13. The method for calibrating clock skew of claim 11, wherein when the signal frequency is higher than a threshold frequency, the skew adjusting circuit is configured to multiply the plurality of detecting signals by a first ratio value to generate the plurality of adjusting signals.

14. The method for calibrating clock skew of claim 11, wherein when the signal frequency is lower than a threshold frequency, the skew adjusting circuit is configured to multiply the plurality of detecting signals by a second ratio value to generate the plurality of adjusting signals.

15. The method for calibrating clock skew of claim 12, wherein the operation of determining the plurality of calculating signals further comprising:

delaying a last one of the plurality of second quantized outputs to generate a delay quantized output;

receiving the delay quantized output and the plurality of second quantized outputs sequentially, and generate a plurality of differential signals according to the delay quantized output and two of the plurality of second quantized outputs respectively;

performing an absolute value computation according to a corresponding differential signal of the plurality of differential signals, to generate a corresponding absolute value signal of the plurality of absolute value signals;

receiving the corresponding absolute value signal and performing a maximum value computation to output a corresponding calculating signal of the plurality of calculating signals, wherein the corresponding calculating signal is generated from a maximum value of the corresponding absolute value signal in the predetermined interval;

performing an average computation, to average the plurality of calculating signals to generate the reference signal;

comparing the reference signal with each of the plurality of calculating signals to generate the plurality of detecting signals; and multiplying the plurality of detecting signals by a first ratio value or a second ratio value to generate the plurality of adjusting signals.

16. The method for calibrating clock skew of claim 11, wherein the operation of generating the plurality of adjusting signals further comprising:

analyzing a plurality of even quantized outputs of the plurality of second quantized outputs, by a first adjusting circuit, to generate a first portion of the plurality of adjusting signals; and analyzing a plurality of odd quantized outputs of the plurality of second quantized outputs, by a second adjusting circuit, to generate a second portion of the plurality of adjusting signals.

17. The method for calibrating clock skew of claim 16, wherein when the signal frequency is higher than a threshold frequency, multiplying a plurality of even detecting signals of the plurality of detecting signals by a first ratio value to generate the first portion of the plurality of adjusting signals, by the first adjusting circuit, and multiplying a plurality of odd detecting signals of the plurality of detecting signals by the first ratio value to generate the second portion of the plurality of adjusting signals, by the second adjusting circuit.

18. The method for calibrating clock skew of claim 16, wherein when the signal frequency is lower than a threshold frequency, multiplying a plurality of even detecting signals of the plurality of detecting signals by a second ratio value to generate the first portion of the plurality of adjusting signals, by the first adjusting circuit, and multiplying a plurality of odd detecting signals of the plurality of detecting signals by the second ratio value to generate the second portion of the plurality of adjusting signals, by the second adjusting circuit.

19. The method for calibrating clock skew of claim 16, wherein the operation of generating the first portion of the plurality of adjusting signals further comprising:

delaying a last one of the plurality of even quantized outputs, to generate a delay quantized output;

receiving the delay quantized output and the plurality of even quantized outputs sequentially, and generating a plurality of differential signals respectively, according to the delay quantized output and two of the plurality of second quantized outputs;

performing an absolute value computation according to a corresponding differential signal of the plurality of differential signals, to generate a corresponding absolute value signal;

receiving a corresponding absolute value signal in the predetermined interval, and performing a statistical computation to generate a corresponding calculating signal of the plurality of calculating signals;

performing an average computation, to average the plurality of calculating signals to generate the reference signal;

comparing the reference signal with each of the plurality of calculating signals, to generate the plurality of detecting signals; and multiplying a plurality of even detecting signals of the plurality of detecting signals by a first ratio value or a second ratio value, to generate the first portion of the plurality of adjusting signals.

20. The method for calibrating clock skew of claim 16, wherein the operation of generating the second portion of the plurality of adjusting signals further comprising:

delaying a last one of the plurality of odd quantized outputs, to generate a delay quantized output;

receiving the delay quantized output and the plurality of odd quantized outputs sequentially, and generating a plurality of differential signals respectively, according to the delay quantized output and two of the plurality of second quantized outputs;

performing an absolute value computation according to a corresponding differential signal of the plurality of differential signals, to generate a corresponding absolute value;

receiving a corresponding absolute value signal in the predetermined interval, and performing a statistical computation to generate a corresponding calculating signal of the plurality of calculating signals;

performing an average computation, to average the plurality of calculating signals to generate the reference signal;

comparing the reference signal with each of the plurality of calculating signals, to generate the plurality of detecting signals; and multiplying a plurality of odd detecting signals of the plurality of detecting signals by a first ratio value or a second ratio value to generate the second portion of the plurality of adjusting signals.

* * * * *